US011955945B2

(12) United States Patent
Shiokawa

(10) Patent No.: US 11,955,945 B2
(45) Date of Patent: Apr. 9, 2024

(54) ELECTRONIC COMPONENT

(71) Applicant: Murata Manufacturing Co., Ltd., Kyoto-fu (JP)

(72) Inventor: Noboru Shiokawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 415 days.

(21) Appl. No.: 17/410,077

(22) Filed: Aug. 24, 2021

(65) Prior Publication Data

US 2022/0069793 A1 Mar. 3, 2022

(30) Foreign Application Priority Data

Sep. 2, 2020 (JP) ................................ 2020-147730

(51) Int. Cl.
*H01F 17/00* (2006.01)
*H01F 17/04* (2006.01)
*H01F 27/30* (2006.01)
*H03H 7/01* (2006.01)

(52) U.S. Cl.
CPC ........... *H03H 7/0176* (2013.01); *H01F 17/04* (2013.01); *H01F 27/30* (2013.01)

(58) Field of Classification Search
CPC .......... H01F 17/00; H01F 17/02; H01F 17/04; H01F 19/00; H01F 27/00; H01F 27/30; H01F 27/29; H01F 27/292; H01F 37/00
USPC .......................................... 333/12, 24.2, 167
See application file for complete search history.

(56) References Cited

U.S. PATENT DOCUMENTS

| | | | | |
|---|---|---|---|---|
| 9,647,310 | B2 * | 5/2017 | Reza | H01P 1/162 |
| 2023/0198564 | A1 * | 6/2023 | Shiokawa | H01F 27/292 333/24 C |

FOREIGN PATENT DOCUMENTS

| | | | |
|---|---|---|---|
| JP | 2000-124034 | A | 4/2000 |
| JP | 2013-219088 | A | 10/2013 |

* cited by examiner

*Primary Examiner* — Hai L Nguyen
(74) *Attorney, Agent, or Firm* — Studebaker & Brackett PC

(57) ABSTRACT

An electronic component capable of obtaining higher attenuation characteristics. The electronic component includes a substrate, a first inductor and a second inductor disposed on a main surface of the substrate, and a transmission line provided on the substrate and connecting the first inductor and the second inductor in series. A first central axis of the first inductor and a second central axis of the second inductor are parallel to a main surface of the substrate and are not located on the same linear line when viewed from a direction orthogonal to the main surface of the substrate. The first inductor and the second inductor are arranged at a distance for magnetic coupling.

9 Claims, 7 Drawing Sheets

ELECTRONIC COMPONENT

CROSS-REFERENCE TO RELATED APPLICATION

This application claims benefit of priority to Japanese Patent Application No. 2020-147730, filed Sep. 2, 2020, the entire content of which is incorporated herein by reference.

BACKGROUND

Technical Field

The present disclosure relates to an electronic component.

Background Art

Conventionally, a communication frequency band adopted in a set of mobile phones and the like is limited, and a noise countermeasure method has been adopted in which a specific frequency band used is matched with a self-resonance frequency of a noise filter such as an inductor to cause a high impedance at a specific frequency in a transmission line.

In this case, an air-core inductor having a high Q value is generally employed, and when a plurality of frequency bands are attenuated by a plurality of components, a frequency band other than the frequency bands used is designed not to be attenuated by antiresonance as a bandpass characteristic of the frequency band. For this reason, in a case where frequencies used are in a wide band or in a case where a plurality of frequencies used are close to each other, appropriate noise countermeasures cannot be taken.

Therefore, conventionally, by adopting an electronic component with an inductor made of a ceramic material (having a magnetic permeability larger than 1), the Q value is lowered, resonance is reduced, and a high-impedance frequency band is widened.

For example, Japanese Patent Application Laid-Open No. 2013-219088 discloses a conventional inductor. The inductor includes a core including a winding core portion, a first flange, and a second flange, a first electrode provided on the first flange, a second electrode provided on the second flange, and a wire electrically connected to the first electrode and the second electrode and wound around the winding core portion. Then, two inductors are prepared, and the two inductors are arranged on a substrate and connected in series via a transmission line to form an electronic component.

SUMMARY

It has been found that there is the following problem when the conventional electronic component is actually manufactured and used. That is, it has been found that when the two inductors are disposed on the substrate in a state in which magnetic coupling is not performed or in a state in which magnetic coupling is weak, the characteristics of the two inductors individually include impedance, and thus higher attenuation characteristics cannot be obtained.

Therefore, the present disclosure provide an electronic component capable of obtaining higher attenuation characteristics.

An electronic component according to an aspect of the present disclosure includes a substrate, a first inductor and a second inductor disposed on a main surface of the substrate, and a transmission line provided on the substrate and connecting the first inductor and the second inductor in series. A first central axis of the first inductor and a second central axis of the second inductor are parallel to a main surface of the substrate and are not located on the same linear line when viewed from a direction orthogonal to the main surface of the substrate. The first inductor and the second inductor are arranged at a distance for magnetic coupling.

Here, the transmission line refers to a wiring that connects the first inductor and the second inductor designed to have a specific characteristic impedance (for example, 50Ω). The distance for magnetic coupling is a distance between the first center of the first inductor and the second center of the second inductor and is within 5 mm when viewed from the direction orthogonal to the main surface of the substrate.

The first central axis of the first inductor refers to an axis extending along a winding direction of a coil constituting the first inductor, and passing through the center of the coil (also referred to as a winding axis of the coil of the first inductor). The second central axis of the second inductor refers to an axis extending along a winding direction of a coil constituting the second inductor, and passing through the center of the coil (also referred to as a winding axis of the coil of the second inductor).

According to the above aspect, in a state where the first central axis of the first inductor and the second central axis of the second inductor are parallel to the main surface of the substrate and are not located on the same linear line when viewed from the direction orthogonal to the main surface of the substrate, the first inductor and the second inductor are arranged at a distance for magnetic coupling, and thus the first inductor and the second inductor are magnetically coupled, and a total inductance value is larger than an intrinsic inductance value of each of the first inductor and the second inductor. As a result, high attenuation characteristics can be obtained in a self-resonance frequency band.

According to the electronic component according to one aspect of the present disclosure, higher attenuation characteristics can be obtained.

DETAILED DESCRIPTION

Hereinafter, an electronic component according to one aspect of the present disclosure will be described in detail with reference to illustrated embodiments. Note that the drawings include some schematic drawings, and may not reflect actual dimensions and ratios.

First Embodiment

Figure 1:
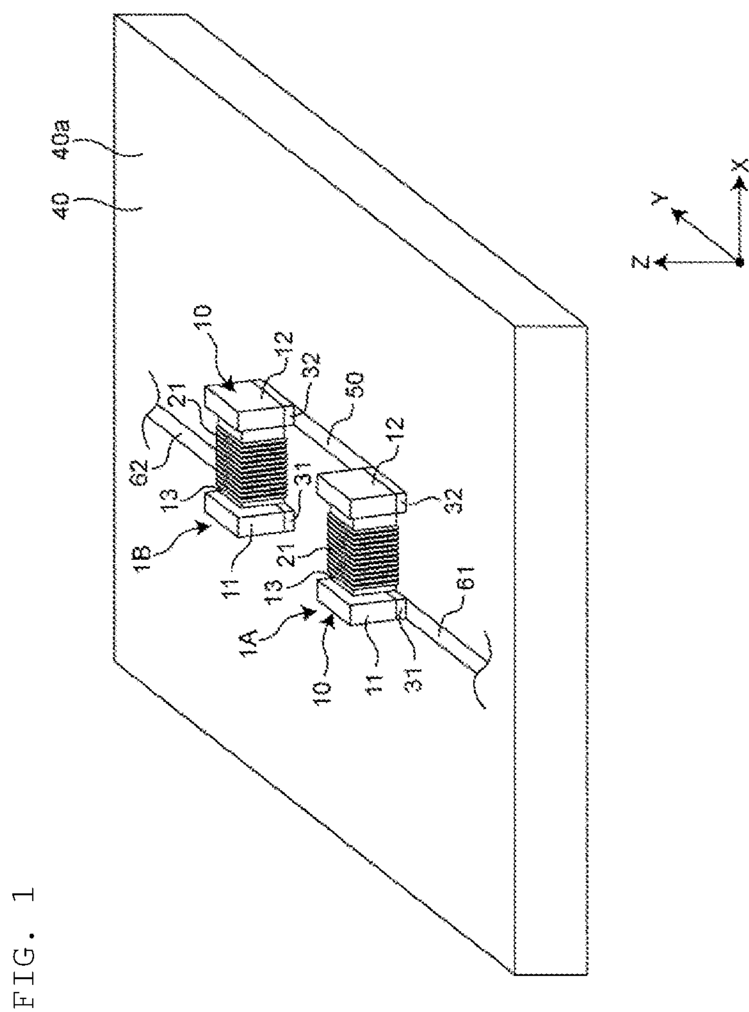
FIG. 1 is a perspective view illustrating an electronic component according to a first embodiment.
Figure 2:
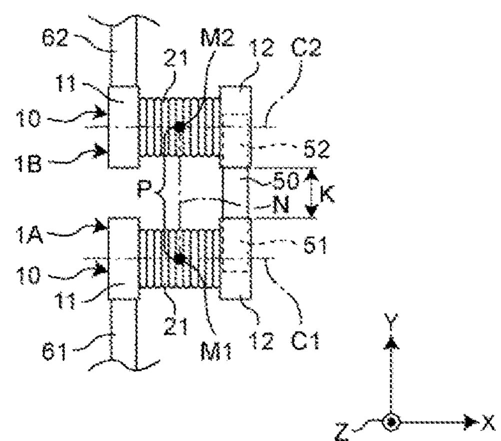
FIG. 2 is a plan view seen from a planar direction of FIG. 1.

FIG. 1 is a perspective view illustrating an electronic component according to a first embodiment. FIG. 2 is a plan view seen from a planar direction of FIG. 1. As illustrated in FIGS. 1 and 2, the electronic component includes a substrate 40, a first inductor 1A and a second inductor 1B disposed on a main surface 40*a* of the substrate 40, and a transmission line 50 provided on the substrate 40 and connecting the first inductor 1A and the second inductor 1B in series. Here, one direction on the main surface 40*a* of the substrate 40 is defined as an X direction, a direction orthogonal to the X direction on the main surface 40*a* of the substrate 40 is defined as a Y direction, and a direction orthogonal to the main surface 40*a* of the substrate 40 is defined as a Z direction. For convenience, the main surface 40*a* of the substrate 40 is a quadrangle, the X direction is one side direction of the main surface 40*a* of the substrate 40, and the Y direction is the other side direction intersecting the one side direction of the main surface 40*a* of the substrate 40.

The first inductor 1A includes a core 10, a first electrode 31 and a second electrode 32 provided in the core 10, and a wire 21 wound around the core 10 and electrically connected to the first electrode 31 and the second electrode 32. Since the second inductor 1B has the same configuration, the description thereof is omitted, but the characteristics of the second inductor 1B are different from the characteristics of the first inductor 1A. For example, the first inductor 1A and the second inductor 1B may have different numbers of turns.

The core 10 includes a winding core portion 13 having a shape extending in a certain direction, a first flange 11 provided at a first end in the extending direction of the winding core portion 13 and extending in a direction orthogonal to the extending direction, and a second flange 12 provided at a second end in the extending direction of the winding core portion 13 and extending in the direction orthogonal to the extending direction. Each of the shape of the winding core portion 13, the shape of the first flange 11, and the shape of the second flange 12 is, for example, a rectangular parallelepiped, but is not limited thereto, and may be another shape, for example, a polygonal prism other than a rectangular parallelepiped, such as a pentagonal prism or a hexagonal prism, or a cylinder. In addition, a part may be a curved surface. Although the first and second flanges 11 and 12 protrude from the entire surface parallel to the extending direction of the winding core portion 13, the first and second flanges 11 and 12 may protrude from one surface of the entire surface of the winding core portion 13.

As a material of the core 10, for example, a magnetic material such as a sintered body of ferrite or a molded body of a magnetic powder-containing resin is preferable, and a non-magnetic material such as alumina, a non-magnetic powder-containing resin, or a resin not containing a filler may be used. The core 10 is solid, but may be hollow (air-core). The magnetic permeability of the core 10 is preferably greater than 1. In the following description, a lower surface of the first flange 11 and a lower surface of the second flange 12 are surfaces mounted on the substrate 40.

The first electrode 31 is provided on the lower surface of the first flange 11, and the second electrode 32 is provided on the lower surface of the second flange 12. The first electrode 31 and the second electrode 32 are formed, for example, by applying and baking a conductive paste containing silver (Ag) as a conductive component, or by sputtering nickel (Ni)—chromium (Cr) or nickel (Ni)—copper (Cu). Further, a plating film may be further formed as necessary. As a material of the plating film, for example, a metal such as tin (Sn), Cu, or Ni, or an alloy such as Ni—Sn can be used. The plating film may have a multilayer structure, or two or more kinds of plating may be used.

The wire 21 is wound around the winding core portion 13 to form a coil. The wire 21 is, for example, a conductive wire with an insulating film, while the conductive wire made of a metal such as copper is covered with the film made of a resin such as polyurethane or polyamideimide. One end of the wire 21 is electrically connected to the first electrode 31, and the other end of the wire 21 is electrically connected to the second electrode 32. The wire 21 and the first and second electrodes 31 and 32 are connected by, for example, thermal pressure bonding, brazing, welding, or the like.

When the first inductor 1A is mounted on the substrate 40, the lower surface of the first flange 11 and the lower surface of the second flange 12 face the main surface 40*a* (upper surface) of the substrate 40. In this case, a first central axis C1 of the first inductor 1A is parallel to the main surface 40*a* of the substrate 40. That is, a winding axis of the wire 21 of the first inductor 1A is parallel to the substrate 40.

Here, being parallel to the main surface 40*a* of the substrate 40 can be rephrased as being parallel to an X-Y plane. In addition, being parallel includes not only being parallel but also being substantially parallel. For example, a deviation (manufacturing error) when the first inductor 1A is mounted on the substrate 40 is allowed.

The first central axis C1 of the first inductor 1A can be rephrased as a winding axis of the coil.

In other words, the first central axis C1 of the first inductor 1A is an axis passing through the center of the winding core portion 13 in the direction in which the winding core portion 13 of the first inductor 1A extends.

The first inductor 1A may further include a cover member (not illustrated). The cover member is provided on an upper surface and a side surface of the winding core portion 13 so as to cover the wire 21 wound around the winding core portion 13. As a material of the cover member, for example, an epoxy resin can be used. For example, when the first inductor 1A is mounted on the substrate 40, the cover member enables suction to be reliably performed by a suction nozzle. In addition, the cover member prevents the wire 21 from being scratched at the time of suction by the suction nozzle.

The substrate 40 has an insulating property and is made of, for example, a phenol resin using paper as a base material (paper phenol substrate), an epoxy resin using glass cloth as a base material (glass epoxy substrate), or the like.

The substrate 40 is, for example, a multilayer substrate, and includes a first layer, a second layer, and a third layer. The first layer, the second layer, and the third layer are laminated in order from the bottom to the top. On the main surface 40*a* of the substrate 40, a first line 61 and a second line 62 as signal lines are arranged. The first line 61 is an input-side signal line, and the second line 62 is an output-side signal line. For example, a power supply line and a ground line are arranged in the first layer and the second layer.

The first electrode 31 of the first inductor 1A is connected to the first line 61, and the first electrode 31 of the second inductor 1B is connected to the second line 62. The second electrode 32 of the first inductor 1A is connected to a first end 51 of the transmission line 50, and the second electrode 32 of the second inductor 1B is connected to a second end 52 of the transmission line 50. As a result, the first line 61, the first inductor 1A, the transmission line 50, the second inductor 1B, and the second line 62 are connected in series. A signal is input to the first line 61 and output from the second line 62.

The first inductor 1A and the second inductor 1B are magnetically coupled. The transmission line 50 is a wiring designed to have a specific characteristic impedance (for example, 50Ω).

The transmission line 50 is provided on the main surface 40*a* of the substrate 40. The transmission line 50 can be easily wired. The first line 61 and the second line 62 also have the same configuration as the transmission line 50.

As illustrated in FIG. 2, the first central axis C1 of the first inductor 1A and a second central axis C2 of the second inductor 1B are parallel to the main surface 40*a* of the substrate 40. The first central axis C1 of the first inductor 1A and the second central axis C2 of the second inductor 1B are not located on the same linear line when viewed from the direction (Z direction) orthogonal to the main surface 40*a* of the substrate 40 (hereinafter, referred to as a plan view). Here, "being on the same linear line" is not limited to a state of being on the same linear line, and includes a state of being substantially on the same linear line.

Specifically, the first inductor 1A and the second inductor 1B overlap each other when viewed from a direction parallel to the main surface 40*a* of the substrate 40 and orthogonal to the first central axis C1 or the second central axis C2. The first central axis C1 and the second central axis C2 are parallel in plan view. Here, being parallel includes not only being parallel but also being substantially parallel. The first central axis C1 and the second central axis C2 extend in the X direction, and are parallel to each other in the Y direction. The first inductor 1A and the second inductor 1B overlap when viewed from the Y direction.

In other words, one surface, parallel to the first central axis C1, of the first flange 11 of the first inductor 1A and one surface, parallel to the second central axis C2, of the first flange 11 of the second inductor 1B are arranged to face each other. One surface, parallel to the first central axis C1, of the second flange 12 of the first inductor 1A and one surface, parallel to the second central axis C2, of the second flange 12 of the second inductor 1B are arranged to face each other.

The first inductor 1A and the second inductor 1B are arranged at a distance P for magnetic coupling. The distance P for magnetic coupling is a distance in a case where a distance between a first center M1 of the first inductor 1A and a second center M2 of the second inductor 1B is within 5 mm in plan view.

According to this, in a state where the first central axis C1 of the first inductor 1A and the second central axis C2 of the second inductor 1B are parallel to the main surface 40*a* of the substrate 40, and are not located on the same linear line in plan view, the first inductor 1A and the second inductor 1B are arranged at a distance for magnetic coupling, and thus the first inductor 1A and the second inductor 1B are magnetically coupled, and a total inductance value is larger than an intrinsic inductance value of each of the first inductor 1A and the second inductor 1B. As a result, high attenuation characteristics can be obtained in a self-resonance frequency band.

In addition, since the first inductor 1A and the second inductor 1B overlap each other when viewed from a direction parallel to the main surface 40*a* of the substrate 40 and orthogonal to the first central axis C1 or the second central axis C2, the first inductor 1A and the second inductor 1B have a positional relationship in which the first inductor 1A and the second inductor 1B are easily magnetically coupled to each other, and higher attenuation characteristics can be obtained.

In addition, since the first central axis C1 and the second central axis C2 are not located on the same linear line in plan view, but are parallel to each other, the first inductor 1A and the second inductor 1B have a positional relationship in which the first inductor 1A and the second inductor 1B are easily magnetically coupled to each other, and higher attenuation characteristics can be obtained. That is, when the first central axis C1 and the second central axis C2 are parallel, a magnetic flux generated in the first inductor 1A easily passes through the second central axis C2 of the second inductor 1B, and a magnetic flux generated in the second inductor 1B easily passes through the first central axis C1 of the first inductor 1A. Therefore, the first inductor 1A and the second inductor 1B are easily magnetically coupled.

An example in this case will be described.

Figure 3:
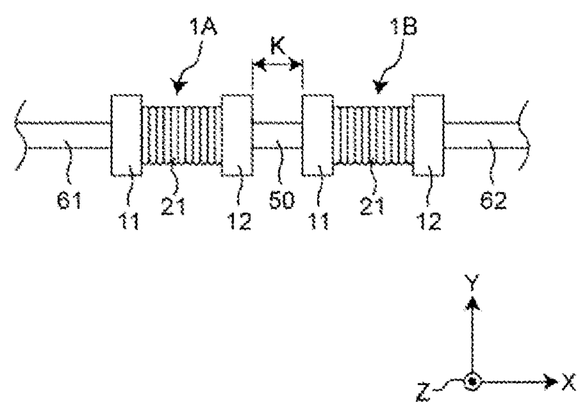
FIG. 3 is a plan view illustrating an electronic component of a comparative example.

In the example, as illustrated in FIG. 2, a shortest distance K between the first inductor 1A and the second inductor 1B is 0.1 mm in plan view. In a comparative example, as illustrated in FIG. 3, the first central axis C1 of the first inductor 1A and the second central axis C2 of the second inductor 1B are located on the same linear line in plan view, and the shortest distance K (that is, the shortest distance K between the second flange 12 of the first inductor 1A and the first flange 11 of the second inductor 1B) between the first inductor 1A and the second inductor 1B is 0.1 mm.

Figure 4:
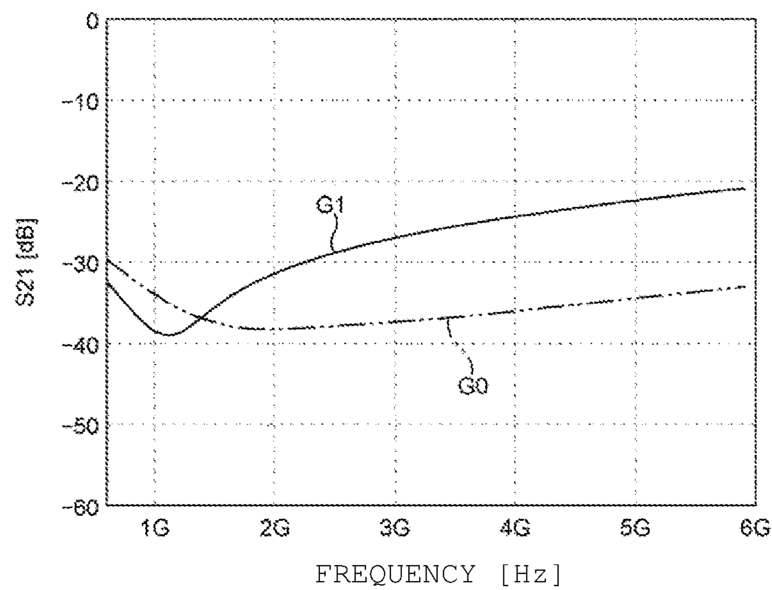
FIG. 4 is a graph showing relationships between frequency and S21 in an example and a comparative example.

FIG. 4 illustrates relationships between frequency and S21 in the example and the comparative example. As illustrated in FIG. 4, a graph G1 of the example was able to have high attenuation characteristics in a low frequency range, as compared with a graph G0 of the comparative example. As described above, in the example, high attenuation characteristics were able to be obtained in a frequency range around 1 GHz, that is, between 600 MHz and 1.8 GHz.

As illustrated in FIG. 2, the transmission line 50 is formed so as not to cross a linear line N connecting the first center M1 and the second center M2 in plan view. That is, the first end 51 of the transmission line 50 is connected to the second electrode 32 of the first inductor 1A, and the second end 52 of the transmission line 50A is connected to the second electrode 32 of the second inductor 1B. Note that the shape of the transmission line 50 is not limited to this shape, and may be a shape as illustrated in FIGS. 5A to 5D.

Figure 5A:
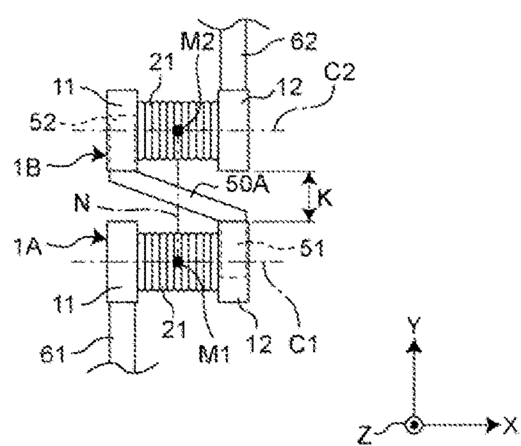
FIG. 5A is a plan view illustrating another shape of a transmission line.

As illustrated in FIG. 5A, a transmission line 50A is formed so as to intersect the linear line N connecting the first center M1 and the second center M2 in plan view. That is, a first end 51 of the transmission line 50A is connected to the second electrode 32 of the first inductor 1A, and a second end 52 of the transmission line 50A is connected to the first electrode 31 of the second inductor 1B. The first line 61 is connected to the first electrode 31 of the first inductor 1A, and the second line 62 is connected to the second electrode 32 of the second inductor 1B.

Figure 5B:
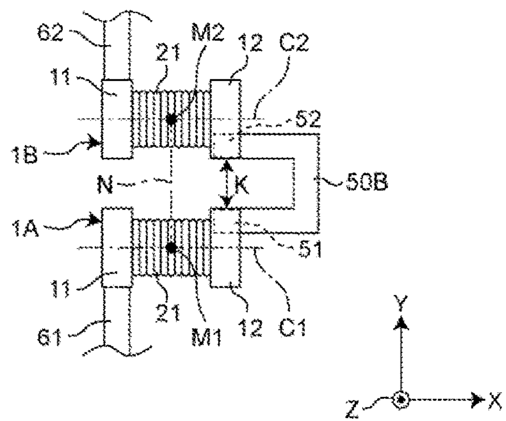
FIG. 5B is a plan view illustrating another shape of the transmission line.
Figure 5C:
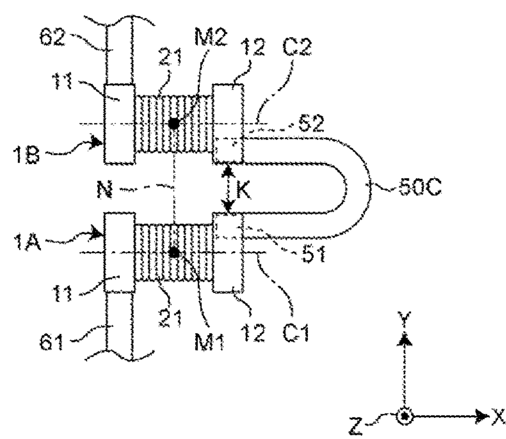
FIG. 5C is a plan view illustrating another shape of the transmission line.
Figure 5D:
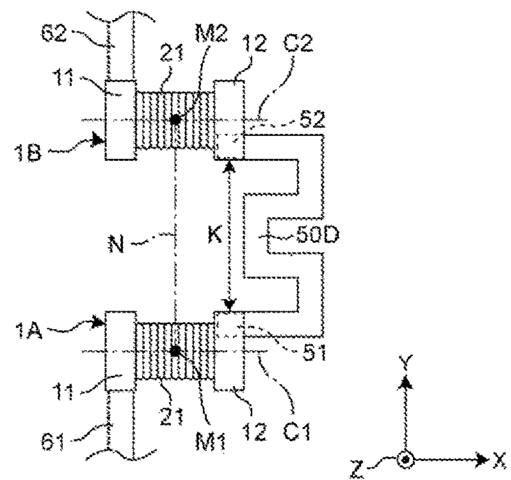
FIG. 5D is a plan view illustrating another shape of the transmission line.

As illustrated in FIG. 5B, a transmission line 50B has a shape having three sides in plan view, and the adjacent sides are orthogonal to each other. According to this, a length of the transmission line 50B can be increased. As illustrated in FIG. 5C, a transmission line 50C has a U-shape in plan view. According to this, since the transmission line 50C does not have a corner portion, fluctuation of the characteristic impedance is small. As illustrated in FIG. 5D, a transmission line 50D may have a meander shape in plan view. According to this, a length of the transmission line 50D can be further increased.

As illustrated in FIG. 2, the first inductor 1A is connected between the first line 61 and the transmission line 50, the second inductor 1B is connected between the second line 62 and the transmission line 50, and the winding direction of the first inductor 1A from the first line 61 toward the transmission line 50 and the winding direction of the second inductor 1B from the transmission line 50 toward the second line 62 are the same direction. That is, the winding direction of the wire 21 wound from the first flange 11 toward the second flange 12 in the first inductor 1A is the same as the winding direction of the wire 21 wound from the second flange 12 toward the first flange 11 in the second inductor 1B. According to this, since the degree of coupling between the first inductor 1A and the second inductor 1B can be increased, higher attenuation characteristics can be obtained.

In addition, the transmission line 50 does not intersect the linear line N connecting the first center M1 and the second center M2 in plan view. According to this, it is possible to reduce an effect of the transmission line 50 on the magnetic flux crossing between the first inductor 1A and the second inductor 1B and to obtain higher attenuation characteristics.

Hereinafter, examples will be described.

Figure 6A:
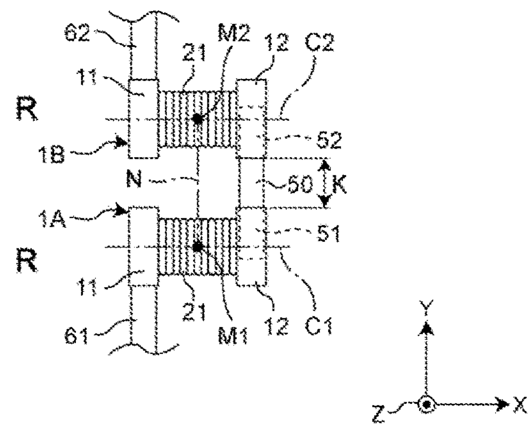
FIG. 6A is a plan view illustrating a first example of winding directions of first and second inductors and the position of the transmission line.

In the first example, as illustrated in FIG. 6A, the shortest distance K between the first inductor 1A and the second inductor 1B is 0.3 mm in plan view. The transmission line 50 does not intersect the linear line N connecting the first center M1 and the second center M2 in plan view. That is, the transmission line 50 is connected to the second electrode 32 of the first inductor 1A and the second electrode 32 of the second inductor 1B. The winding direction of the first inductor 1A from the first line 61 toward the transmission line 50 is clockwise (indicated as "R" in the drawing. The same applies hereinafter.). The winding direction of the second inductor 1B from the transmission line 50 toward the second line 62 is clockwise.

Figure 6B:
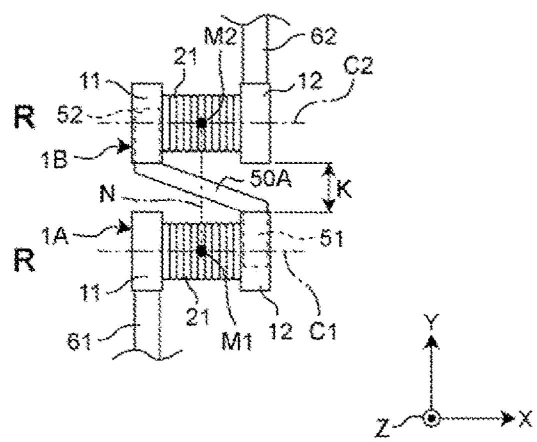
FIG. 6B is a plan view illustrating a second example of the winding directions of the first and second inductors and the position of the transmission line.

In the second example, as illustrated in FIG. 6B, the shortest distance K between the first inductor 1A and the second inductor 1B is 0.3 mm in plan view. The transmission line 50A intersects the linear line N connecting the first center M1 and the second center M2 in plan view. That is, the transmission line 50A is connected to the second electrode 32 of the first inductor 1A and the first electrode 31 of the second inductor 1B. The winding direction of the first inductor 1A from the first line 61 toward the transmission line 50A is clockwise, and the winding direction of the second inductor 1B from the transmission line 50A toward the second line 62 is clockwise.

Figure 6C:
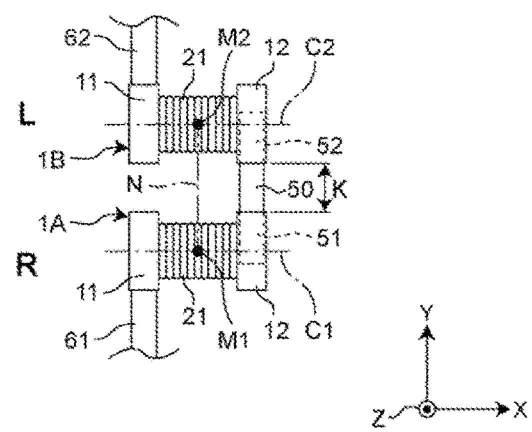
FIG. 6C is a plan view illustrating a third example of the winding directions of the first and second inductors and the position of the transmission line.

In the third embodiment, as illustrated in FIG. 6C, the shortest distance K between the first inductor 1A and the second inductor 1B is 0.3 mm in plan view. The transmission line 50 does not intersect the linear line N connecting the first center M1 and the second center M2 in plan view. That is, the transmission line 50 is connected to the second electrode 32 of the first inductor 1A and the second electrode 32 of the second inductor 1B. The winding direction of the first inductor 1A from the first line 61 toward the transmission line 50 is clockwise, and the winding direction of the second inductor 1B from the transmission line 50 toward the second line 62 is counterclockwise (indicated as "L" in the drawing. The same applies hereinafter.).

Figure 6D:
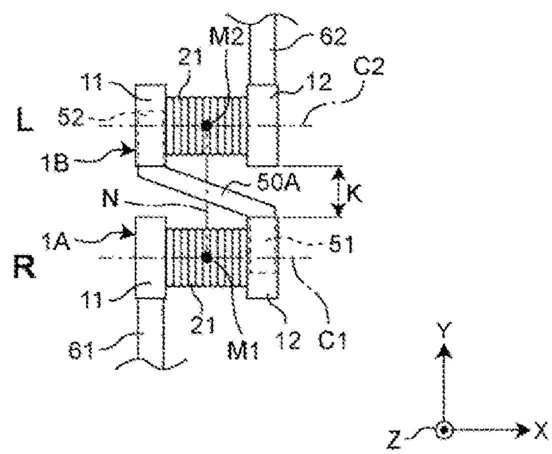
FIG. 6D is a plan view illustrating a fourth example of the winding directions of the first and second inductors and the position of the transmission line.

In the fourth example, as illustrated in FIG. 6D, the shortest distance K between the first inductor 1A and the second inductor 1B is 0.3 mm in plan view. The transmission line 50A intersects the linear line N connecting the first center M1 and the second center M2 in plan view. That is, the transmission line 50A is connected to the second electrode 32 of the first inductor 1A and the first electrode 31 of the second inductor 1B. The winding direction of the first inductor 1A from the first line 61 toward the transmission line 50A is clockwise, and the winding direction of the second inductor 1B from the transmission line 50A toward the second line 62 is counterclockwise.

Figure 7:
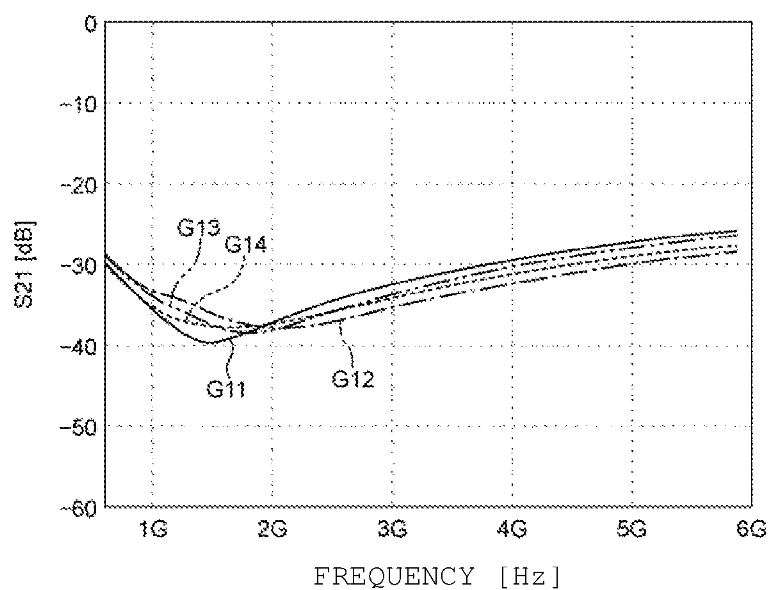
FIG. 7 is a graph illustrating relationships between frequency and S21 in the first to fourth examples.

FIG. 7 illustrates relationships between frequency and S21 in the first to fourth examples. As illustrated in FIG. 7, a graph G11 of the first example was able to have high attenuation characteristics in a low frequency range, as compared with a graph G12 of the second example, a graph G13 of the third example, and a graph G14 of the fourth example. In addition, the positions of the high attenuation characteristics were able to be shifted to the low frequency side in the order of the graph G12 of the second example, the graph G13 of the third example, and the graph G14 of the fourth example. As described above, in the first to fourth examples, it has been confirmed that there is a difference in coupling degree due to effects of the winding directions of the inductors and the arrangement of the transmission lines, and as a result, the attenuation characteristics are different. In addition, the graphs G11 to G14 of the first to fourth examples were able to have high attenuation characteristics in a low frequency range as compared with the graph G0 of the comparative example illustrated in FIG. 4.

Second Embodiment

Figure 8:
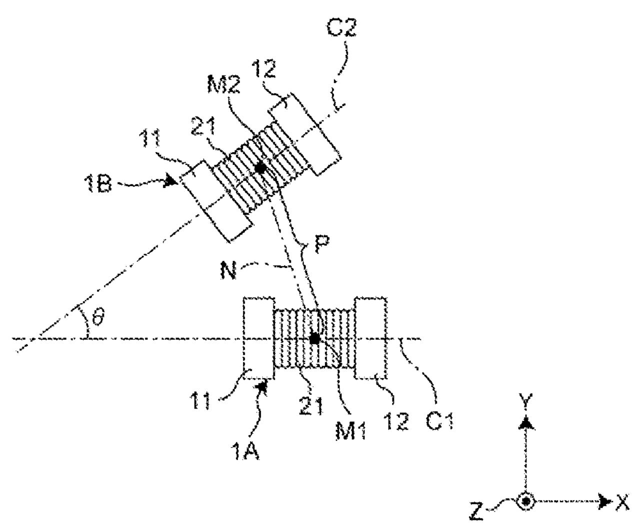
FIG. 8 is a plan view illustrating an electronic component according to a second embodiment.

FIG. 8 is a plan view illustrating an electronic component according to a second embodiment. The second embodiment is different from the first embodiment in the arrangement of the first inductor and the second inductor. This different configuration will be described below. The other configurations are the same as those of the first embodiment, and are denoted by the same reference numerals as those of the first embodiment, and the description thereof will be omitted.

As illustrated in FIG. 8, in the electronic component according to the second embodiment, the first central axis C1 of the first inductor 1A and the second central axis C2 of the second inductor 1B intersect each other at a preset set angle θ in plan view. The set angle θ is larger than 0° and smaller than 45° (i.e., from more than 0° to less than 45°. As a result, the first inductor 1A and the second inductor 1B have a positional relationship in which the first inductor 1A and the second inductor 1B are easily magnetically coupled, and higher attenuation characteristics can be obtained.

Specifically, the first inductor 1A and the second inductor 1B are inclined such that the first flanges 11 of the first and second inductors 1A and 1B are positioned close to each other and the second flanges 12 of the first and second inductors 1A and 1B are positioned away from each other. In this case, the first inductor 1A and the second inductor 1B overlap in a direction orthogonal to the first central axis C1 or the second central axis C2 in plan view. The distance between the first center M1 of the first inductor 1A and the second center M2 of the second inductor 1B is within 5 mm, which is the distance P defined in the first embodiment.

The first inductor 1A and the second inductor 1B may be inclined such that the first flanges 11 are positioned away from each other and the second flanges 12 are positioned close to each other. Similarly, in this case, the first central axis C1 intersects the second central axis C2 at the set angle θ in plan view.

Note that the present disclosure is not limited to the above-described embodiments, and can be modified in design without departing from the gist of the present disclosure. For example, the respective features of the first and second embodiments may be variously combined.

In the above embodiments, the two inductors are used in the electronic component, but the number of inductors may be increased. In the above embodiments, wound inductors are used as the inductors, but laminated inductors may be used.

The winding direction of the first inductor and the winding direction of the second inductor may be either clockwise or counterclockwise from the first electrodes toward the second electrodes. The winding direction of the first inductor and the winding direction of the second inductor may be forward with respect to the extending direction of the transmission line.

Further, the transmission line is not limited to the main surface of the substrate, and may be provided inside the substrate. In addition, a length of the transmission line between the first end and the second end of the transmission line is the same as the shortest distance between the first end and the second end, but may be longer than the shortest distance.

What is claimed is:

1. An electronic component comprising:

a substrate;

a first inductor and a second inductor disposed on a main surface of the substrate; and a transmission line on the substrate and connecting the first inductor and the second inductor in series, wherein a first central axis of the first inductor and a second central axis of the second inductor are parallel to a main surface of the substrate and are not located on the same linear line when viewed from a direction orthogonal to the main surface of the substrate, and the first inductor and the second inductor are arranged at a distance for magnetic coupling.

2. The electronic component according to claim 1, wherein the first inductor and the second inductor overlap each other when viewed from a direction parallel to the main surface of the substrate and orthogonal to the first central axis or the second central axis.

3. The electronic component according to claim 2, wherein the first central axis and the second central axis are parallel when viewed from the direction orthogonal to the main surface of the substrate.

4. The electronic component according to claim 3, further comprising:

a first line and a second line on the substrate, wherein the first inductor is connected between the first line and the transmission line, the second inductor is connected between the second line and the transmission line, and a winding direction of the first inductor from the first line toward the transmission line and a winding direction of the second inductor from the transmission line toward the second line are the same direction.

5. The electronic component according to claim 4, wherein the transmission line does not intersect a linear line connecting a first center of the first inductor and a second center of the second inductor when viewed from the direction orthogonal to the main surface of the substrate.

6. The electronic component according to claim 2, further comprising:

a first line and a second line on the substrate, wherein the first inductor is connected between the first line and the transmission line, the second inductor is connected between the second line and the transmission line, and a winding direction of the first inductor from the first line toward the transmission line and a winding direction of the second inductor from the transmission line toward the second line are the same direction.

7. The electronic component according to claim 6, wherein the transmission line does not intersect a linear line connecting a first center of the first inductor and a second center of the second inductor when viewed from the direction orthogonal to the main surface of the substrate.

8. The electronic component according to claim 1, further comprising:

a first line and a second line on the substrate, wherein the first inductor is connected between the first line and the transmission line, the second inductor is connected between the second line and the transmission line, and a winding direction of the first inductor from the first line toward the transmission line and a winding direction of the second inductor from the transmission line toward the second line are the same direction.

9. The electronic component according to claim 8, wherein the transmission line does not intersect a linear line connecting a first center of the first inductor and a second center of the second inductor when viewed from the direction orthogonal to the main surface of the substrate.

* * * * *